(12) United States Patent
Basinger et al.

(10) Patent No.: US 6,666,340 B2
(45) Date of Patent: Dec. 23, 2003

(54) UNIVERSAL RACK RAIL

(75) Inventors: Ray G. Basinger, Spring, TX (US); John R. Grady, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/029,767

(22) Filed: Dec. 18, 2001

(65) Prior Publication Data

US 2003/0111436 A1 Jun. 19, 2003

(51) Int. Cl.$^7$ .................................................. A47F 5/00
(52) U.S. Cl. ...................... 211/26; 211/175; 312/265.4; 312/334.4
(58) Field of Search ........................ 211/26, 175, 189; 312/334.4, 334.5, 265.4

(56) References Cited

U.S. PATENT DOCUMENTS

| | | | | |
|---|---|---|---|---|
| 5,833,337 A | * | 11/1998 | Kofstad | 312/334.5 |
| 5,941,621 A | * | 8/1999 | Boulay et al. | 312/334.4 |
| 6,230,903 B1 | * | 5/2001 | Abbott | 211/26 |
| 6,422,399 B1 | * | 7/2002 | Castillo et al. | 211/26 |
| 6,520,346 B1 | * | 2/2003 | Liu | 211/26 |

* cited by examiner

Primary Examiner—Robert W. Gibson, Jr.

(57) ABSTRACT

A rack rail assembly having an adjustable length that can be installed, without any tools or loose hardware, into a rack having mounting holes that are square or circular. It is also preferred that the rack rail assembly be reversible and able to support sliding and fixed deployment modes as well as cable mounting equipment. Accordingly, one preferred embodiment of the rack rail assembly comprises inner and outer rail members that are slidingly engaged. The rail members are adjustable lengthwise to be able to be used with various depth racks. The assembly further comprises a primary locking mechanism that locks the rails together at the desired length. The primary locking mechanism is further coupled to a biasing mechanism that allows the rails to be compressed for installation within a rack. Each end of the rail assembly has at least two pins that interface with mounting holes located in the rack. Preferably, the pins are capable of interfacing with circular or rectangular mounting holes. The rail assembly further comprises a secondary locking mechanism that locks the inner and outer rail together once the rail assembly is installed in the rack. The rack rail assembly further provides attachment points so a deployment rail can be installed once the rail assembly is installed on the rack. Depending on the desired application, either a sliding or a fixed deployment rail can be installed. The rail assembly also includes mounting point for cable management equipment.

31 Claims, 7 Drawing Sheets

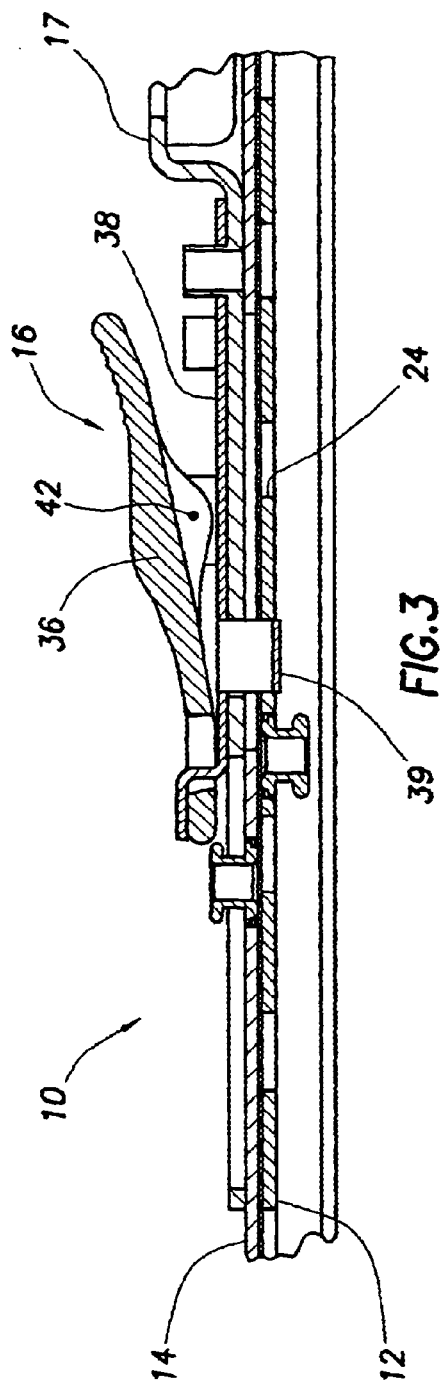
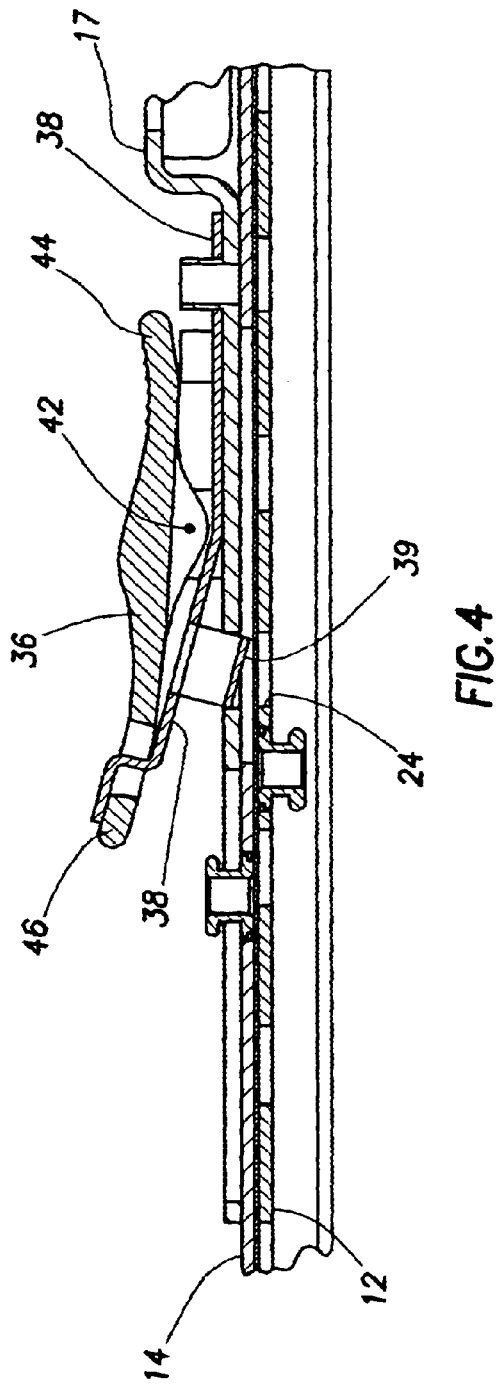

UNIVERSAL RACK RAIL

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to mechanisms for mounting drawers, components and the like to a frame, such as a cabinet or rack. More particularly, the present invention relates to rack rails that are used to support electronic packages stored within an electronics rack housing.

2. Background of the Invention

The necessity for specialized computer equipment has increased dramatically over recent years, and it is not uncommon for an organization to require several computers to act as servers controlling their local area networks. For larger corporations that require numerous servers, an industry standard EIA (Electronics Industries Alliance), or other type, rack is often used to contain servers in a stacked arrangement that uses the available space more efficiently.

Such electronics racks are relatively simple structures that closely resemble open-frame bookcases. Computer server/component racks are typically constructed with perforated, hinged front-doors, rigid sides and a removable rear panel. Industry standard 19" EIA electronics racks are designed typically to house a column of electronics packages that are 17-¾" in width with varying depths. The height of an electronics package can vary but is normally an integer multiple of an EIA unit called simply the "U." An EIA U is 1.75 inches. Electronic equipment generally has a height in multiples of "Us" e.g., 1U (1.75"), 2U (3.50"), 3U (5.25"), etc.

Typically, electronic components may be secured within the rack using a pair of rack rails that are secured to the rack structure. These rails may fix the component in place or support sliding mechanisms that enable the component to be easily moved in and out of the rack. Corresponding rails are located on the side surfaces of the electronics component, thus allowing the component to be pulled in and out of the rack frame easily.

Some companies with high computing requirements may require dozens of racks, with each rack holding multiple servers or other components. A simple maintenance task, such as upgrading a part of a server, may have to be performed on each server and therefore may be performed hundreds of times. For example, when a system is being built, a great deal of time is spent configuring the rack structure and physically installing components into the rack. The assembly of most prior art rack structures has required the use of tools and loose hardware, such as small screws. Manipulating and managing this loose hardware takes time and adds to the costs of installing and maintaining these rack systems. The costs of managing loose hardware for a large system can be significant. These costs are further multiplied if the user has several different styles of racks that require the use of a mixture of different rack rails because it takes time for the user to learn how to mount and maintain separate styles of rails. Most prior art rack rails are available in either a fixed or sliding deployment mode configuration, therefore requiring even more hardware to change between the two deployment modes. Furthermore, most prior art rack rails are either left or right handed, thus requiring different rails for each side of a single server unit. All of these drawbacks of the prior art combine to drive up the costs of purchasing, installing, and maintaining rack rails.

Therefore, there remains a need in the art for rack rails that are adjustable, fit in multiple styles of racks, and require less time to deploy so that users can get the servers up and running as quickly as possible. It is also desirable to have a rack rail that can be installed or removed without any tools and can be used in both sliding and fixed server applications. The preferred embodiments of the present invention described below overcome these and other deficiencies of the prior art while focusing on these needs.

BRIEF SUMMARY OF THE PREFERRED EMBODIMENTS OF THE INVENTION

The preferred embodiments of the present invention overcome the deficiencies of the prior art noted above, by providing a rack rail assembly that can easily be used in a variety of rack types. Accordingly, one preferred embodiment of the rack rail assembly comprises inner and outer rail members that are slidingly engaged so that the rack rail assembly is adjustable lengthwise so that it can be used with various depth racks. The assembly further comprises a primary locking mechanism that locks the rails together at the desired length and is coupled to a biasing mechanism that allows the rails to be compressed for installation within a rack. Each end of the rail assembly has pins that interface with mounting holes located in the rack and are held in place without nuts or other hardware. Preferably, the pins are capable of interfacing with circular or rectangular mounting holes. The rail assembly further comprises a secondary locking mechanism that locks the inner and outer rail together once the rail assembly is installed in the rack to prevent the biasing mechanism from allowing the rail assembly to compress and fall out of the rack.

The rack rail assembly further provides attachment points so a deployment rail can be installed once the rail assembly is installed on the rack. Depending on the desired application, either a sliding or a fixed deployment rail can be installed. The rail assembly also includes a mounting point for cable management equipment.

It is preferred that the rack rail assembly be able to be installed without using any tools or requiring any loose hardware. One preferred embodiment of the rack rail assembly is installed by adjusting the length of the rail assembly and engaging the primary locking mechanism. One preferred method for installing the rack rail comprises (1) adjusting the rail assembly to a desired length, (2) inserting the pins on one end of the assembly into the appropriate mounting holes in the rack, (3) compressing the rail assembly, (4) inserting the on the opposite end of the assembly into the appropriate mounting holes in the rack, (5) allowing the rail assembly to expand, and (6) engaging the secondary rail lock, and (7) installing the desired deployment rail and cable management equipment. This procedure is repeated for the rail on the opposite side of the rack. Preferred embodiments of the rack rail assembly can be used as either the left or right rail, therefore eliminating the need for rails of multiple designs.

Accordingly, this particular embodiment of the present invention provides a rack rail that can be used in any type rack having any depth. The rack rail can be installed without the need for tools or loose hardware and is able to be used as either the right or left hand rail. This particular embodiment provides attachment points for the user's choice of deployment rails, such as fixed or sliding, as well as attachment points for cable management equipment. Therefore, the present invention provides a rack rail that decreases the costs of installing and maintaining racked server systems.

BRIEF DESCRIPTION OF THE DRAWINGS

For a detailed description of the preferred embodiments of the invention, reference will now be made to the accompanying drawings in which:

FIG. 3 is a sectional side-view of one embodiment of the primary locking mechanism in a locked position;

FIG. 4 is a sectional side-view of one embodiment of the primary locking mechanism in an unlocked position;

NOTATION AND NOMENCLATURE

Figure 1:
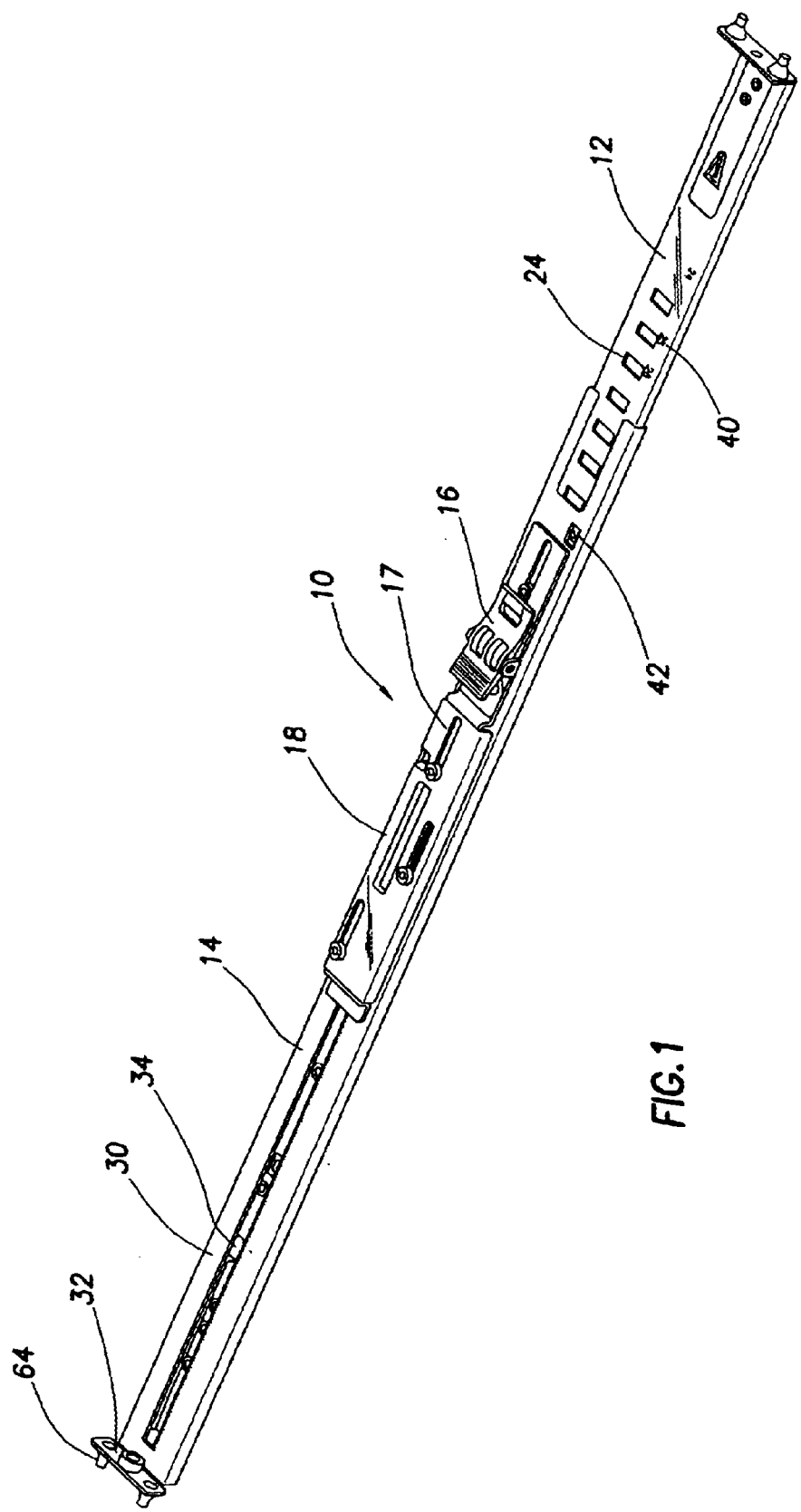
FIG. 1 is an isometric view of the outer side of a rack rail assembly.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The term "rack" is meant to refer to a racking system that has vertical uprights into which the rails attach.

DETAILED DESCRIPTION OF THE PREFERRED EMBODIMENTS

In the description that follows, like parts are marked throughout the specification and drawings with the same reference numerals, respectively. The drawing figures are not necessarily to scale. Certain features of the invention may be shown exaggerated in scale or in somewhat schematic form and some details of conventional elements may not be shown in the interest of clarity and conciseness.

In order to fully describe the preferred embodiments of the present invention, reference will be made throughout this description to a mounting system to attach computer server to a rack, but the concepts described herein are applicable to other types of computers as well as non-computer applications. The present invention is susceptible to embodiments of different forms. There are shown in the drawings, and herein will be described in detail, specific embodiments of the present invention with the understanding that the present disclosure is to be considered an exemplification of the principles of the invention, and is not intended to limit the invention to that illustrated and described herein.

Figure 2:
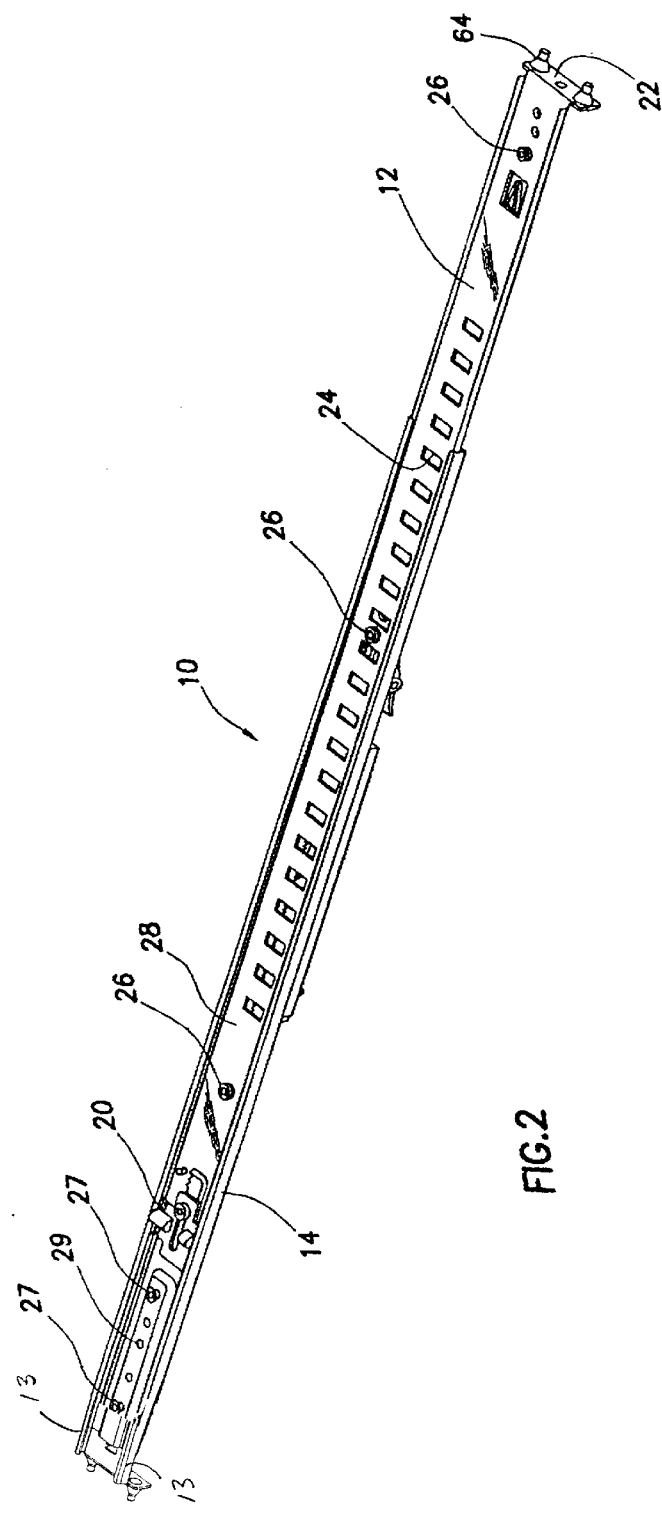
FIG. 2 is an isometric view of the inner side of a rack rail assembly.

Referring now to FIGS. 1 and 2, one embodiment of a rack rail 10 is comprised of an inner rail member 12, an outer rail member 14, a primary locking mechanism 16, a biasing mechanism 18, and a secondary locking mechanism 20. The outer rail member 14 retains the inner rail member 12, preferably by way of a c-shaped channel 13, and allows the inner rail to slide lengthwise in relation to outer rail member 14. The inner rail 12 may be retained by any other means, for example pins or slots, that allow lengthwise movement between the two rails 12, 14.

Outer rail 14 comprises an elongated member 30 with c-shaped channel 13 on either long edge and one end 32 adapted to interface with a rack through alignment/mounting pins 64. Primary locking mechanism 16 and biasing mechanism 18 are both mounted to a housing 17 that is slidably attached to member 30. A toothed slot 34 extends lengthwise along a portion of the length of member 30.

Inner rail 12 comprises an elongated channel shaped member 28 with one end 22 adapted to interface with a rack through alignment/mounting pins 64. Member 28 also comprises a plurality of holes 24 spaced along its length. A plurality of mounting spools 26, 27 as well as the secondary locking mechanism 20 are attached to the one side of inner rail 12.

It is preferred that rack rail 10 be adjustable through a range of lengths, thus allowing the rail to be used in racks of varying depths. Without limitation, one preferred range of adjustment is from a length of approximately 24" to 36". The length of rail 10 is adjusted using the primary locking mechanism 16. Referring now to FIG. 3, a partial cross-section of rail 10 is shown, illustrating the interaction between the inner rail 12 and the primary locking mechanism 16, which is attached to outer rail 14. Primary locking mechanism 16 comprises an extension release latch 36 and the extension rail lock 38, both attached to housing 17.

Referring still to FIG. 3, extension release lock 38, which is connected to housing 17, is preferably made of a flexible spring steel material and, in a locked position, passes through the outer rail 14 and interfaces with one of the plurality of holes 24 in the inner rail 12. Extension release latch 36 is attached to housing 17 at center point 42 and comprises a first end 44, and a second end 46 adapted to connect to release lock 38. Latch 36 is pivotally connected to housing 17 at center point 42.

Referring now to FIG. 4, release lock 38 is released by depressing latch 36 at the first end 44, which will disengage the lock from the hole 24 on the inner rail 12. Once the release lock 38 is disengaged, the length of the rail 10 can then be adjusted to the desired length simply by pulling or pushing the rails 12,14. Once the desired length is obtained, latch 36 is released and tab 39 of release lock 38 falls down into the appropriate hole 24 in inner rail member 12, locking the two rails 12, 14 at the desired length.

Referring back to FIG. 1, rack depth numbers 40 have been etched onto the inner rail member 12 for ease of adjustment. As the inner rail member 12 is adjusted, rack depth numbers 40 appear in the adjustment viewing window 42. Therefore, when the depth at which the rack rail 10 will be mounted appears in the adjustment viewing window 40, the extension release latch 36 is released and the rails 12, 14 are locked together at the appropriate length.

Figure 5:
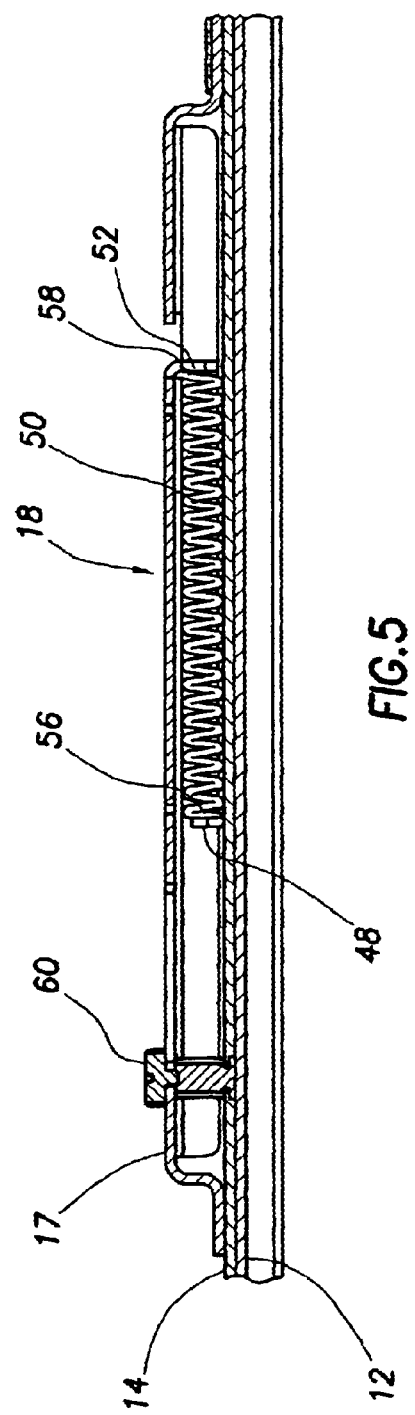
FIG. 5 is a sectional side-view of one embodiment of the biasing mechanism.
Figure 6:
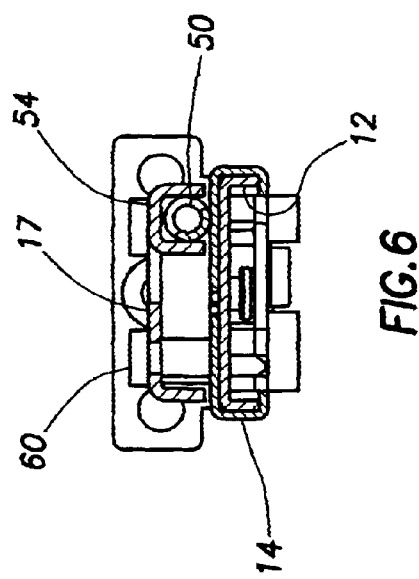
FIG. 6 is a sectional end-view of one embodiment of the biasing mechanism.

Once the desired rack depth set, the rack rail 10 is configured for installation. In order to make the universal rack rail 10 easy and quick to install, the inner rail member 12 and the outer rail member 14 are connected by biasing mechanism 18 that allows the rack rail 10 to be easily compressed for installation into a server rack. Referring now to FIG. 5 and FIG. 6, biasing mechanism 18 generally comprises a compression spring 50, having a first end 58 and a second end 56. Spring 50 is contained within channel 54 in housing 17. First end 58 of spring 50 bears against a tab 52 on housing 17 and second end 56 bears against a tab 48 on the outer rail 14.

During the assembly of rack rail 10, housing 17 is attached to the outer rail 14 by screws 60, or some other fastener in a slot that allows the housing to slide relative to the rail. Assuming that the outer rail 14 remains stationary, when the inner rail 12 is pushed, a force is exerted on the extension rail lock 38 that extends through the inner rail member 12. Since the extension rail lock 38 is physically attached to housing 17, a force is also applied to the housing. Therefore, when a force is applied to inner rail member 12, and subsequently to housing 17, tab 52 in housing 17 pushes against spring 50 causing it to compress and allowing the depth of the rack rail 10 to decrease slightly. When inner rail member 12 is released, spring 50 expands, pushing the rack rail 10 back to its original depth.

Figure 7:
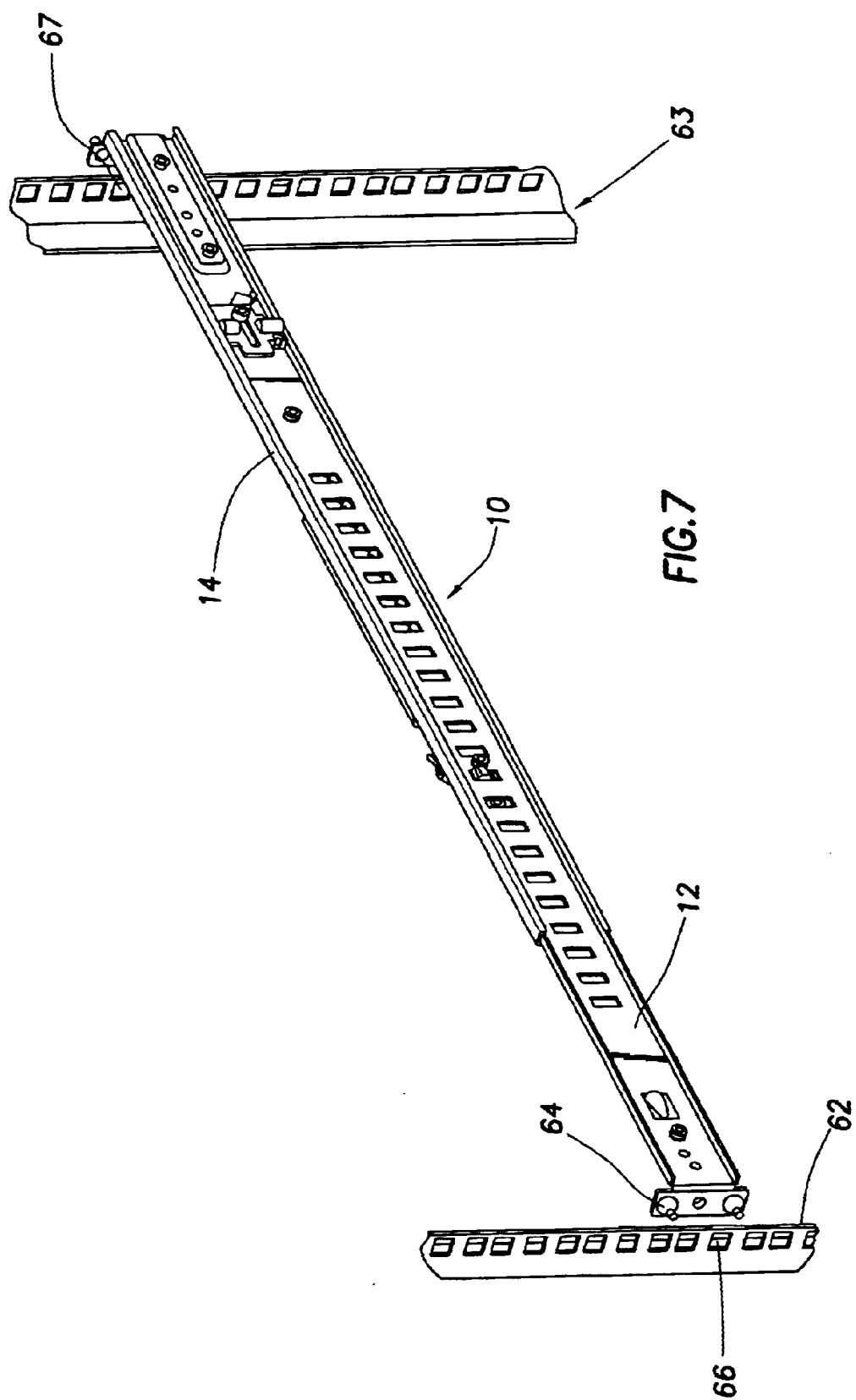
FIG. 7 is an isometric view of a rack rail assembly in relation to a rack.

FIG. 7 illustrates the process of installing the rail 10 into a rack. The rack rail 10 is connected to rack uprights 62, 63 by (a) lining up alignment/mounting pins 64 connected to inner rail member 12 with the appropriate mounting holes 66 in the front 62 of the rack, (b) compressing rail 10, (c) lining up the alignment/mounting pins 64 connected to outer rail member 14 with the appropriate mounting holes 67 in the rear 63 of the rack, and (d) allowing rail 10 to expand. Once rail 10 has expanded, the tension, created by spring 50, and alignment/mounting pins 64, will hold the rail in place. Therefore, rail 10 can be installed easily into a rack without using any tools or loose hardware.

Figure 8:
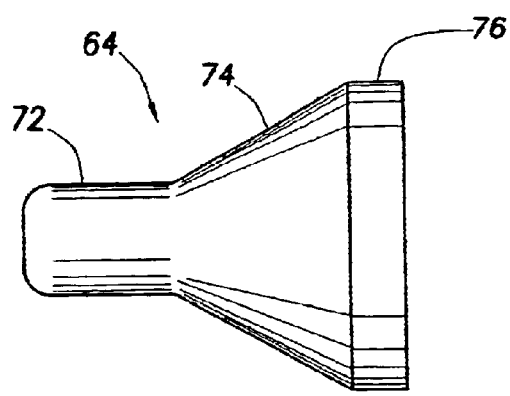
FIG. 8 is one embodiment of an alignment/mounting pin.

Alignment/mounting pins 64 are specially adapted to fit in a wide variety of component racks. Referring now to FIG. 8, alignment/mounting pins 64 comprise a first cylindrical portion 72 having a smooth transition into a conical portion 74 and a second cylindrical portion 76 having a diameter equal to the largest diameter of the conical portion. The first cylindrical portion 72 is located at the head of the pin 64 and serves as a guide to guide the pin into a mating hole on a rack. The conical portion 74 of alignment/mounting pin 64 allows the pin to mount into the standard, circular mounting holes of a variety of sizes. Preferably, pin 64 can interface with mounting holes ranging from 10–32 to M6. The second cylindrical portion 76 at the base of alignment/mounting pin 64 allows the pin to fit into square mounting holes that are typical to some rack designs.

Figure 9:
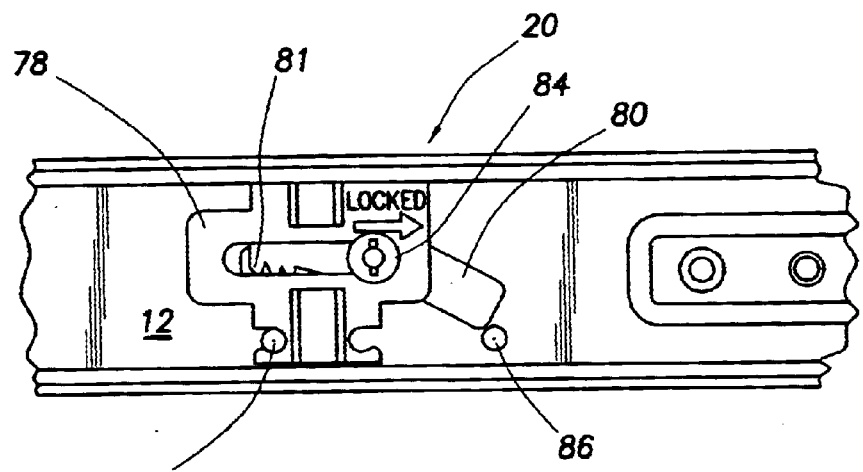
FIG. 9 is a side view of one embodiment of a secondary locking mechanism shown in an unlocked position.

In order to prevent rail 10 from compressing and falling out of the rack during the installation of a server, a secondary locking mechanism 20 is preferably provided. FIG. 9 shows one embodiment of a secondary locking mechanism 20 in an unlocked position. Secondary locking mechanism 20 comprises a spring lock actuator 78 and a spring lock pawl 80. Spring lock pawl 80 is assembled over a standoff 84 in inner rail member 12 so that it can rotate about the standoff. Spring lock pawl 80 has a saw tooth pattern 81 on a head that protrudes through the inner rail 12 into the outer rail 14 and fits into toothed slot 34 on the outer rail. Actuator 78 is assembled over pawl 80 and when moved forward and backward causes the pawl 80 to rotate about standoff 84 and raise in and out of the toothed slot 34 in outer rail 14. Bullet-nose standoffs 86 on inner rail 12 are provided so that actuator 78 can snap into the locked or un-locked position.

Figure 10:
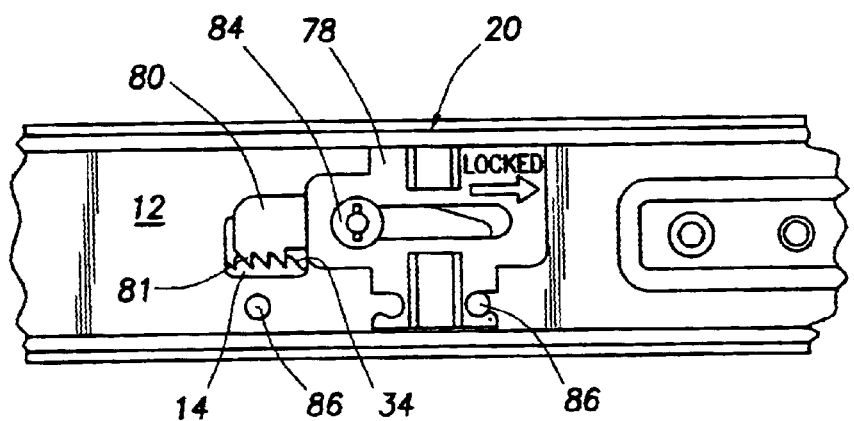
FIG. 10 is a side view of one embodiment of a secondary locking mechanism shown in a locked position.
Figure 11:
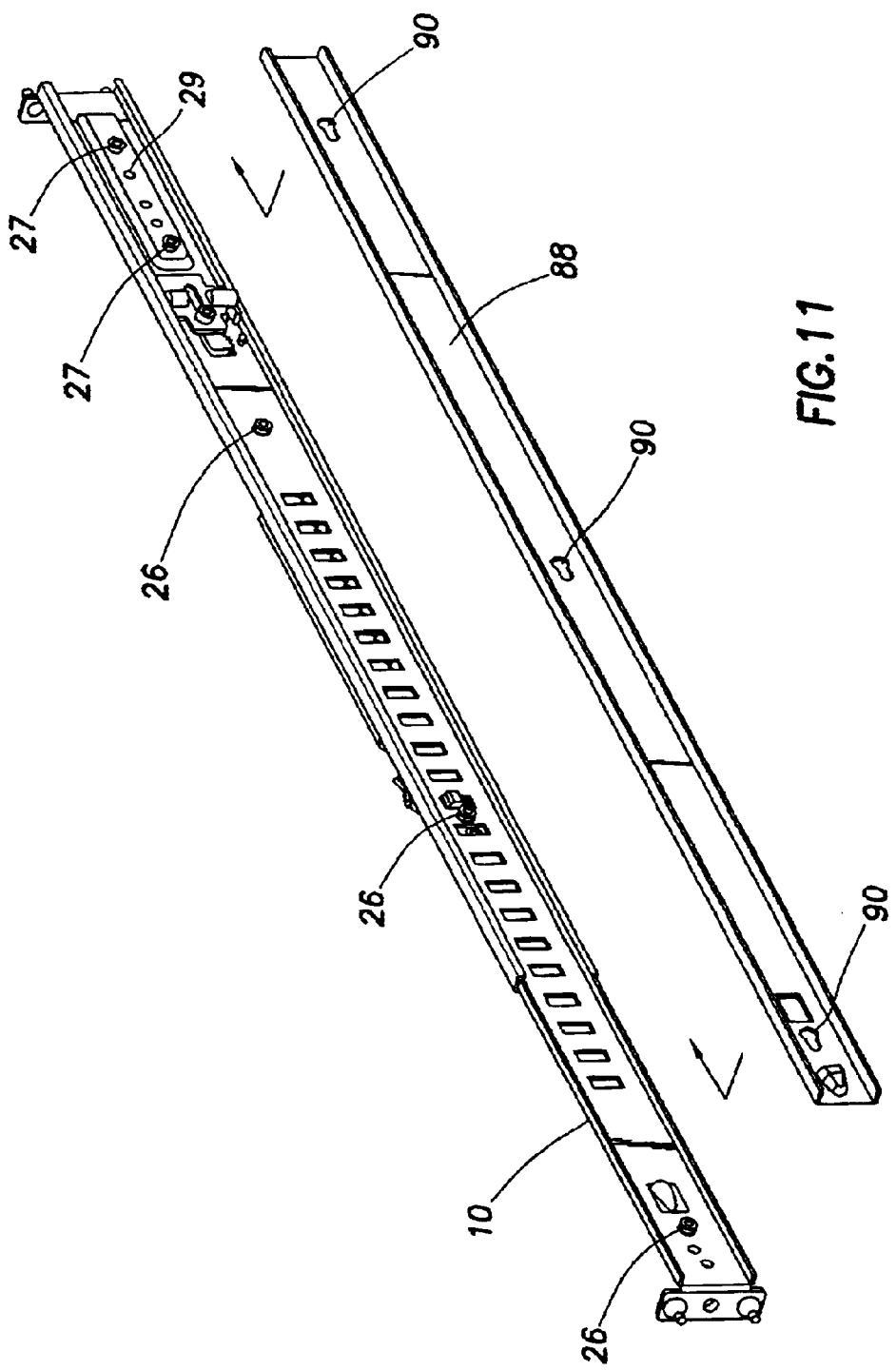
FIG. 11 is an isometric view of a rack rail assembly in relation to a deployment rail.

A deployment rail can be attached to a rack rail assembly either before or after installation into a rack. The deployment rail provides the attachment points for the equipment to be stored in the rack and may be fixed or slidable relative to the rack. Inner rail 12 is provided with a plurality of attachment spools 26 that serve as attachment points for a deployment rail. FIG. 10 shows one example of a fixed deployment rail 88 in position to be installed on rail 10. Deployment rail 88 has a plurality of slotted holes 90 that are spaced to interface with spools 26. The deployment rail 88 simply snaps into place on rail 10 by inserting spools 26 through slotted holes 90 and sliding the deployment rail 88 into place. Referring back to FIG. 1, inner rail 12 preferably also has attachment points, either spools 27 or threaded holes 29, for the attachment of cable management equipment.

Construction of the main rail members is preferably made of 18 gauge cold rolled steel. Construction of the spring housing is preferably made of 16 gauge cold rolled steel. The construction of the extension rail lock is preferably 22 gauge spring steel. The spring lock pawl is preferably a cast part and is preferably constructed of aluminum alloy 380. The alignment/mounting pin is preferably a machine part constructed of leaded carbon steel with a zinc plate. The extension release latch and spring lock actuator are preferably constructed of a Lexan plastic.

Therefore the preferred embodiments of the present invention described above provide a rack rail assembly that is adjustable in length so as to be used with racks of various depths and is capable of mounting in racks having both circular and rectangular mounting holes. The preferred rack rail assembly also is capable of being used in either a left or right side configuration as well as supporting either a fixed or sliding deployment mode. Effectively, the preferred embodiments of the present invention provides a rack rail assembly that can be used in a variety of different racks and rack designs, therefore eliminating the need for a user to maintain multiple rack rail configurations. The usefulness and efficiency of the preferred embodiment of the rack rail assembly is further enhanced because the rack rail assembly can be completely installed or removed without any tools or loose hardware.

The above discussion is meant to be illustrative of the principles and various embodiments of the present invention. Numerous variations and modifications will become apparent to those skilled in the art once the above disclosure is fully appreciated. For example, a rail designed in accordance with the present invention could be used in a non-computer environment as a drawer slide or other such device. It is intended that the following claims be interpreted to embrace all such variations and modifications.

What is claimed is:

1. A rack rail assembly, comprising:
   an outer rail;
   an inner rail slidingly engaged with said outer rail;
   a primary locking system that limits sliding of the inner rail relative to the outer rail in an engaged position and allows adjustment from a first length to a second length in a disengaged position;
   a biasing member that allows the inner rail to be moved relative to the outer rail when the primary locking system is in the engaged position; and
   a secondary locking system that prevents the inner rail from being moved relative to the outer rail in an engaged position.

2. The rack rail assembly of claim 1, wherein said rack rail assembly is installed in a rack having circular or rectangular mounting holes, said rack rail assembly further comprising a plurality of pins for interfacing with the mounting holes, said pins comprising a conical surface for interfacing with circular mounting holes and a cylindrical surface for interfacing with rectangular mounting holes.

3. The rack rail assembly of claim 1 further comprising a housing slidably mounted to said outer rail, wherein said primary locking mechanism and said biasing member are attached to said housing.

4. The rack rail assembly of claim 1 wherein said primary and secondary locking systems can be actuated without any tools.

5. The rack rail assembly of claim 1 wherein said first length is 24" and said second length is 36".

6. The rack rail assembly of claim 1 further including a deployment rail adapted to receive a mounted component.

7. The rack rail assembly of claim 6 wherein said deployment rail maintains the mounted component in a fixed position.

8. The rack rail assembly of claim 6 wherein said deployment rail enables the mounted component to slide relative to the rack rail.

9. The rack rail assembly of claim 6 wherein said rack rail assembly can be used on either the left or right side of the mounted component.

10. The rack rail assembly of claim 1 wherein said primary locking mechanism comprises a latch member and a locking member, wherein said locking member is biased to the engaged position and is moved to the disengaged position by said latch member.

11. A method for installing a rack rail assembly into a rack, wherein the rack rail assembly has an adjustable length and comprises an inner rail and an outer rail that are slidably attached, said method comprising:
   actuating a latch to release a primary locking mechanism;
   sliding at least one of the rails to adjust the length of the assembly to a desired length;
   releasing the latch to engage a primary locking mechanism;
   engaging one of the rails and the rack;
   compressing the rack rail assembly; and
   releasing the rack rail assembly so that the assembly expands to engage the other rail and the rack.

12. The method of claim 11 further comprising actuating a secondary locking mechanism to prevent relative motion between the inner and outer rails.

13. The method of claim 12 further comprising installing a deployment rail onto the rack rail.

14. The method of claim 13 wherein all the steps are performed without any tools.

15. A rack rail assembly comprising:
   a first rail;
   a second rail slidably disposed to said first rail;
   a means for adjusting the location of said second rail in relation to said first rail between a first position and a second position;
   a means for biasing said second rail to an extended position and allowing said second rail to be moved to a compressed position, wherein said means for biasing acts without moving between the first position and the second position; and
   a means for locking said second rail to said first rail that does not allow relative motion between the rails.

16. The rack rail assembly of claim 15 further comprising a means for interfacing with circular or rectangular mounting holes on a rack.

17. The rack rail assembly of claim 15 further comprising a means for attachment of a deployment rail.

18. The rack rail assembly of claim 17 wherein said means for attachment of the deployment rail comprises a means for attaching a component in a fixed position.

19. The rack rail assembly of claim 17 wherein the deployment rail comprises a means for enabling a component to slide relative to the rack rail assembly.

20. The rack rail assembly of claim 15 wherein the location of said second rail in relation to said first rail can vary by at least 12".

21. A rack rail assembly comprising:
   a first rail;
   a second rail slidingly engaged with said first rail and adjustable between a first length and a second length;
   a first locking mechanism that limits the translation of the first and second rail and allows the assembly to be compressed for installation into a rack; and
   a second locking mechanism that fixes the location of said first rail in relation to said second rail once the rack rail assembly is placed in a rack.

22. The rack rail assembly of claim 21 wherein said assembly is installed in a rack without any loose hardware.

23. A rack assembly, comprising:
   a pair of opposing rack rail assemblies for holding electronics, each rail assembly comprising:
      an outer rail;
      an inner rail slidingly engaged with said outer rail;
      a primary locking system that limits sliding of the inner rail relative to the outer rail in an engaged position and allows adjustment from a first length to a second length in a disengaged position;
      a biasing member that allows the inner rail to be moved relative to the outer rail when the primary locking system is the engaged position; and
      a secondary locking system that prevents the inner rail from being moved relative to the outer rail in an engaged position.

24. The rack assembly of claim 23, wherein said rack rail assemblies are installed in a rack having circular or rectangular mounting holes, said rack rail assemblies further comprising a plurality of pins for interfacing with the mounting holes, said pins comprising a conical surface for interfacing with circular mounting holes and a cylindrical surface for interfacing with rectangular mounting holes.

25. The rack assembly of claim 23 wherein said rack rail assemblies further comprise a housing slidably mounted to said outer rail, wherein said primary locking mechanism and said biasing member are attached to said housing.

26. The rack assembly of claim 23 wherein said primary and secondary locking systems can be actuated without any tools.

27. The rack assembly of claim 23 wherein said first length is 24" and said second length is 36".

28. The rack assembly of claim 23 further comprising deployment rails attached to said rack rail assemblies and adapted to receive a mounted component.

29. The rack assembly of claim 28 wherein said deployment rails maintain the mounted component in a fixed position.

30. The rack assembly of claim 28 wherein said deployment rails enable the mounted component to slide relative to the rack.

31. The rack assembly of claim 28 wherein said primary locking mechanism comprises a latch member and a locking member, wherein said locking member is biased to the engaged position and is moved to the disengaged position by said latch member.

* * * * *